United States Patent
Narayanan et al.

(10) Patent No.: US 11,709,203 B2
(45) Date of Patent: *Jul. 25, 2023

(54) TRANSITION FAULT TESTING OF FUNCTIONALLY ASYNCHRONOUS PATHS IN AN INTEGRATED CIRCUIT

(71) Applicant: TEXAS INSTRUMENTS INCORPORATED, Dallas, TX (US)

(72) Inventors: Prakash Narayanan, Karnataka (IN); Sundarrajan Rangachari, Karnataka (IN); Prashanth Saraf, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/690,821

(22) Filed: Mar. 9, 2022

(65) Prior Publication Data

US 2022/0196738 A1  Jun. 23, 2022

Related U.S. Application Data

(63) Continuation of application No. 16/220,209, filed on Dec. 14, 2018, now Pat. No. 11,300,615.

(60) Provisional application No. 62/611,759, filed on Dec. 29, 2017.

(51) Int. Cl.
| | | |
|---|---|---|
| G01R 31/3183 | (2006.01) | |
| G01R 31/3185 | (2006.01) | |
| G01R 31/3181 | (2006.01) | |
| G01R 31/317 | (2006.01) | |

(52) U.S. Cl.
CPC ........ *G01R 31/318307* (2013.01); *G01R 31/31726* (2013.01); *G01R 31/31727* (2013.01); *G01R 31/31813* (2013.01); *G01R 31/318552* (2013.01); *G01R 31/318558* (2013.01); *G01R 31/31708* (2013.01)

(58) Field of Classification Search
None
See application file for complete search history.

(56) References Cited

U.S. PATENT DOCUMENTS

| | | |
|---|---|---|
| 4,914,379 A | 4/1990 | Maeno |
| 6,442,722 B1 | 8/2002 | Nadeau-Dostie et al. |
| 7,904,857 B2 | 3/2011 | Wang et al. |
| 8,862,954 B1 | 10/2014 | Wang |
| 9,529,044 B1 | 12/2016 | Taneja et al. |
| 11,300,615 B2 * | 4/2022 | Narayanan ....... G01R 31/31727 |
| 2012/0062266 A1 | 3/2012 | Gorti et al. |
| 2014/0310666 A1 | 10/2014 | Chung |

(Continued)

*Primary Examiner* — Thien Nguyen
*Assistant Examiner* — Matthew W Wahlin
(74) *Attorney, Agent, or Firm* — Krista Y. Chan; Frank D. Cimino (57) ABSTRACT

A circuit includes a test circuit in an integrated circuit to test signal timing of a logic circuit under test in the integrated circuit. The signal timing includes timing measurements to determine if an output of the logic circuit under test changes state in response to a clock signal. The test circuit includes a bit register that specifies which bits of the logic circuit under test are to be tested in response to the clock signal. A configuration register specifies a selected clock source setting from multiple clock source settings corresponding to a signal speed. The selected clock source is employed to perform the timing measurements of the specified bits of the bit register.

20 Claims, 4 Drawing Sheets

(56) References Cited

U.S. PATENT DOCUMENTS

2017/0322588 A1  11/2017  Lillestolen et al.
2017/0328952 A1  11/2017  Huang et al.

\* cited by examiner

| ADDRESS OFFSET | 0x0000 0054 | | |
|---|---|---|---|
| DESCRIPTION | OVERRIDE FUSE VALUES | | |
| TYPE | RW | | |
| BITS | FIELD NAME | DESCRIPTION | TYPE | RESET |
| 31-29 | REG 1 | RESERVED | RW | 0b00x |
| 28-24 | REG 1 | FUSE OVERRIDE | RW | 0x04 |
| 23 | REG 1 | RESERVED | RW | X |
| 22-16 | REG 1 | FUSE OVERRIDE | RW | 0x14 |
| 15-13 | REG 1 | RESERVED | RW | 0b00x |
| 12-8 | REG 1 | FUSE OVERRIDE | RW | 0x04 |
| 7-5 | REG 1 | RESERVED | RW | 0b00x |
| 4-0 | REG 1 | FUSE OVERRIDE | RW | 0x04 |

FIG. 5

| ADDRESS OFFSET | 0x0000 0054 | | |
|---|---|---|---|
| DESCRIPTION | OVERRIDE FUSE VALUES | | |
| TYPE | RW | | |
| BITS | FIELD NAME | DESCRIPTION | TYPE | RESET |
| 31-29 | REG 1 | 610 RESERVED | RW | 0b00x |
| 28-24 | REG 1 | DYNAMIC BITFIELD FUSE OVERRIDE | RW | 0x04 |
| 23 | REG 1 | 630 RESERVED | RW | X |
| 22-16 | REG 1 | STATIC BITFIELD FUSE OVERRIDE | RW | 0x14 |
| 15-13 | REG 1 | 620 RESERVED | RW | 0b00x |
| 12-8 | REG 1 | DYNAMIC BITFIELD FUSE OVERRIDE | RW | 0x04 |
| 7-5 | REG 1 | 640 RESERVED | RW | 0b00x |
| 4-0 | REG 1 | STATIC BITFIELD FUSE OVERRIDE | RW | 0x04 |

TRANSITION FAULT TESTING OF FUNCTIONALLY ASYNCHRONOUS PATHS IN AN INTEGRATED CIRCUIT

CROSS REFERENCE TO RELATED APPLICATIONS

This application is a continuation of U.S. patent application Ser. No. 16/220,209 filed on Dec. 14, 2018 which claims the benefit of U.S. Provisional Patent Application 62/611,759 filed on 29 Dec. 2017, and entitled TRANSITION FAULT TESTING OF FUNCTIONALLY ASYNCHRONOUS PATHS IN AN INTEGRATED CIRCUIT, the entireties of which are incorporated by reference herein.

TECHNICAL FIELD

This disclosure relates to integrated circuits, and more particularly to a test circuit that includes a configuration register to specify differing clock sources for logic under test in order that both dynamic and static circuit paths can be functionally tested.

BACKGROUND

The higher clock frequencies and smaller geometry sizes in today's integrated circuits have led to an increase in speed related defects which are commonly referred as transition delay faults. Thus, it is desirable that the devices are screened for such faults using at-speed testing. Effective scan-based at-speed test techniques are available in leading automated test pattern generator (ATPG) tools. The most common at-speed tests to check for manufacturing defects and process variations include test patterns created for the transition and path-delay fault models.

While creating at-speed test patterns, it is desirable to account for timing exceptions and constraints such as false and multi-cycle paths. If these paths are not handled correctly during scan-based at-speed test pattern generation, it can lead to lower test quality by failing otherwise passing chips on the tester which reduces product yield. False Paths (also referred to as functionally asynchronous paths) are those timing arcs in design where changes in source registers are not expected to be captured by the destination register within a particular time interval. Such paths can be categorized under various design topologies such as a) static false path—timing arc in design where excitation of source register will not have any impact or change in destination register, b) False reset timing arc, or c) asynchronous false path (e.g., core data register (CDC) Path)—where clock domain of the source register is asynchronous to the clock domain of the destination register and then the path is considered as asynchronous. A multi-cycle path in a sequential circuit is a combinational path which does not have to complete the propagation of the signals along the path within one clock cycle. For a multi-cycle path of N, a given design should ensure the signal transition propagated from source to destination occurs within N clock cycles.

Typically, a false path in a circuit is not activated because of the circuit functionality and delay values of the circuit components. However, a scan-in operation during scan-based at-speed test can load in nonfunctional states, which may sensitize these paths. Such patterns may eventually fail on silicon as these paths are not timing closed in station. This may cause a passing chip to be branded as a defective chip and hence resulting in yield loss.

In order to avoid such scenario, the source of a false/multi-cycle path can be marked as a dynamic 'X' (unknown value) source in the ATPG. In case of designs using scan compression, the ATPG coverage can be severely degraded in the presence of increased density 'X' sources and it could potentially impact the effective achievable compression. The X-sources can limit both unload compression by masking observation, and the load compression by requiring additional care bits to prevent Xs or avoid their effect on unload data. Failure in effective handling of X-sources may impact the observability of the other non-X scan cells and can potentially inflict lower test coverage and increase in test pattern count.

SUMMARY

This disclosure relates to a test circuit in an integrated circuit that includes a configuration register to specify differing clock sources for logic under test in order that both dynamic and static circuit paths can be functionally tested. In one example, a circuit includes a test circuit in an integrated circuit to test signal timing of a logic circuit under test in the integrated circuit. The signal timing includes timing measurements to determine if an output of the logic circuit under test changes state in response to a clock signal. The test circuit includes a bit register that specifies which bits of the logic circuit under test are to be tested in response to the clock signal. A configuration register specifies a selected clock source from multiple clock source settings corresponding to a signal speed. The selected clock source is employed to perform the timing measurements of the specified bits of the bit register.

In another example, a system includes an automatic test pattern generator (ATPG) to generate test signals that specify which bits to test and to select a clock speed of the bits to test for a logic circuit under test in an integrated circuit. A test circuit in the integrated circuit tests signal timing of the logic circuit under test in the integrated circuit in response to the test signals from the ATPG. The signal timing includes timing measurements to determine if an output of the logic circuit under test changes state in response to a clock signal. The test circuit includes a bit register that receives which bits of the logic circuit under test are to be tested from the ATPG and in response to the clock signal. A configuration register specifies a selected clock source from multiple clock source settings corresponding to a signal speed. The selected clock source is employed to perform the timing measurements of the specified bits of the bit register.

In yet another example, a method includes specifying which bits of a logic circuit under test are to be tested in response to a clock signal via register transfer-level (RTL) instructions that are implemented on an integrated circuit. The method includes specifying a selected clock source from multiple clock source settings corresponding to a signal speed via the RTL instructions. The method includes applying the selected clock source to clock the specified bits in the logic circuit under test. The method includes determining if an output of the logic circuit under test changes state in response to the clock source.

DETAILED DESCRIPTION

This disclosure relates to a test circuit in an integrated circuit that includes a configuration register to specify differing clock sources for logic under test in order that both dynamic and static circuit paths can be functionally tested. The test circuit can be implemented within the design of the integrated circuit to test signal timing of the logic circuit under test in the integrated circuit. The signal timing includes timing measurements to determine if an output of the logic circuit under test changes state in response to a clock signal. Such timing can include transition fault testing where signals are applied to a given circuit path in the circuit under test and measured to determine whether the signal transitioned within a given timing window.

The test circuit includes a bit register that specifies which bits of the logic circuit under test are to be tested in response to the clock signal. A configuration register in the test circuit specifies a selected clock source from multiple clock source settings corresponding to a signal speed. The selected clock source is employed to perform the timing measurements of the specified bits of the bit register. In one example, higher speed testing paths can be designated as dynamic testing paths and can be tested at maximum speeds of the testing system. Functionally asynchronous paths (FAPs) are paths that cannot be tested in the same manner as the dynamic paths and are referred to as static testing paths where slower clock speeds are specified to test the static paths. Thus, the configuration register allows for the specification of different clock source settings for testing depending on the type of circuit path to be tested. Such clock source specification provides substantially increased performance over conventional testing systems that may have chosen not to test the FAP in some cases (e.g., by use of "X" designation in ATPG to ignore the path) and/or used gating circuits to disable the FAP in other situations.

Functionally asynchronous paths exist in circuits under test where the FAP cannot be tested according to the same timing constraints as a valid timing path in the circuit under test which can be tested at the highest clock speeds of the system. For example, FAPs may not be able to be tested at maximum clock speed or can be subject to some other constraint such as multi-cycle testing where the path is tested at some number of clocking transitions that are different that the valid timing path. The FAPs can be defined by a starting point and an end point and often times are connected to one or more other full testing paths which can be delay fault tested at speed. Delay fault testing refers to causing a state transition in the path and detecting whether or not the transition occurred within a predetermined timing window. Transitions occurring within the timing window are considered valid whereas transitions occurring outside the timing window are designated as a delay fault.

In previous testing implementations where FAPs were encountered, several different techniques were employed to account for the FAP including clock gating, using pattern masks, and using testing constraints (e.g., rules) to guide the ATPG. With respect to cell constraint/pattern masks—in this approach, an X cell constraint can be placed on the destination flop (e.g., end point logic). This results in lower test coverage since other valid timing paths that may use the end point logic as a transition capture location would not be testable.

One other technique is the use of testing constraints in the automatic test pattern generator (ATPG). Most ATPG tools have recently developed the capability to read in timing exceptions details and comprehend the exceptions during at-speed test pattern generation. Although the ATPG can handle the false/multi-cycle path effectively, most often it is observed to have a negative impact on the ATPG quality of results (QoR) such as increased pattern count and reduced test coverage, for example. Also, the total mask pattern count is found to significantly increase which in turn can cause an increase in total test-time.

In this disclosure, the configuration register allows for specifying different clock sources for testing which allows all paths in the integrated circuit to be tested at the clock speed designated for the respective path. This mitigates the need to employ rules or pattern masking in the ATPG to avoid testing of the FAP at speed and thus increases the quality of the underlying integrated circuit since more paths can be tested. Also, since the circuit paths can be tested according to specified timing for the given path, additional and expensive gating circuitry to disable the FAP for high speed testing can be eliminated.

Figure 1:
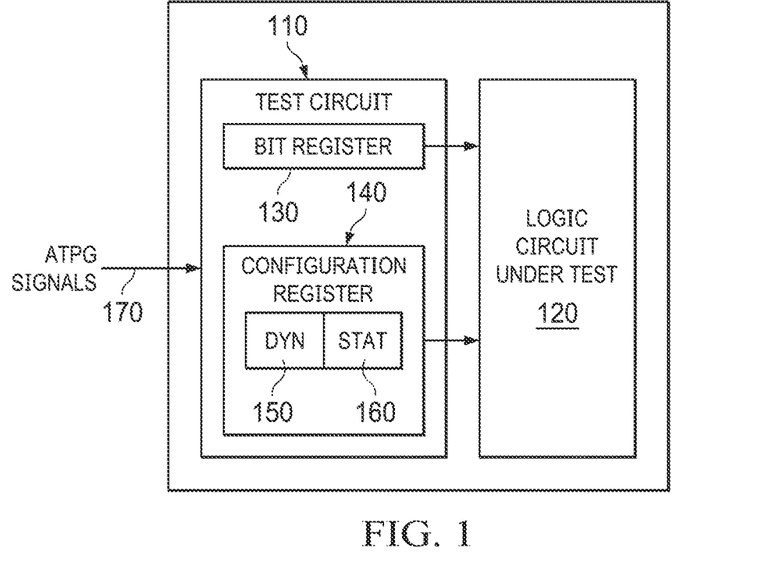
FIG. 1 illustrates an example block diagram of an integrated circuit having a test circuit that provides multiple clock sources to test a logic circuit under test.

FIG. 1 illustrates an example block diagram of an integrated circuit 100 having a test circuit 110 that provides multiple clock sources to test a logic circuit 120 under test. As used herein, the term "circuit" can include a collection of active and/or passive elements that perform a circuit function, such as an analog circuit or control circuit. Additionally or alternatively, for example, the term "circuit" can include an integrated circuit (IC) where all and/or some of the circuit elements are fabricated on a common substrate (e.g., semiconductor substrate).

The integrated circuit 100 includes the test circuit 110 in the integrated circuit to test signal timing of the logic circuit 120 under test in the integrated circuit. The signal timing includes timing measurements to determine if an output of the logic circuit 120 under test changes state in response to a clock signal. The test circuit 110 includes a bit register 130 that specifies which bits of the logic circuit 120 under test are to be tested in response to the clock signal. A configuration register 140 specifies a selected clock source from multiple clock source settings corresponding to a signal speed. The selected clock setting is employed to perform the timing measurements of the specified bits of the bit register 130.

In one example, one of the clock source settings from the multiple clock source settings specifies a dynamic clock speed DYN 150 that is employed to perform the timing measurements of the specified bits of the bit register 130 at a maximum clock speed for the logic circuit under test. In another example, one of the clock source settings from the multiple clock speeds specifies a static clock speed STAT 160 that is employed to perform the timing measurements of the specified bits of the bit register 130 at a clock speed for the logic circuit under test that is less than the dynamic clock speed. As used herein, the term dynamic refers to the maximum clock speed in which a given circuit path in the logic circuit 120 can be tested. The term static refers to any circuit path that is specified for testing at a clock speed that is less than the clock speed for testing of the dynamic path. Although static and dynamic clock sources are mentioned, other clock source settings can be specified in the configuration register 140 for testing of other circuit paths in the logic circuit 120. For example, one clock source may be specified as the dynamic for a subset of paths, another clock source may be specified as static for another subset of testing paths, and still yet another clock source (other than the dynamic or static sources) can be specified for yet another subset of testing paths in the logic circuit 120. A plurality of such clock sources can be specified in the configuration register 140 which can be applied to a plurality of different testing paths depending on the timing determined for the given path. As shown, the test circuit 110 can be driven by one or more ATPG signals 170 to control transition fault testing as described herein. An ATPG system for testing the integrated circuit 100 is illustrated and described below with respect to FIG. 3.

In another example, one bit specified in bit register is clocked at one clock speed and another bit specified in bit register is clocked at another clock speed to test the logic circuit under test. The bit register 130 and the configuration register 140 can be implemented via register transfer-level (RTL) instructions that specify the bits to be tested in the bit register and the clock source for the bits to be tested in the configuration register. In digital circuit design, RTL is a design abstraction which models a synchronous digital circuit in terms of the flow of digital signals (data) between hardware registers, and the logical operations performed on those signals. Register-transfer-level abstraction is used in hardware description languages (HDLs) such as Verilog and Very High Speed Integrated Circuit Design Language (VHDL), for example, to create high-level representations of a circuit, from which lower-level representations and ultimately actual integrated circuit connections can be derived. Examples of such RTL instructions are described below with respect to Tables 1 and 2 which are provided with respect to the discussion of FIG. 6.

The RTL instructions can specify a default testing value for the bits to be tested as specified in the bit register 130. Also, the RTL instructions can specify bits at a bit register address to be tested at one clock source setting and specify other bits at the bit register address to be tested at another clock source setting (see e.g., in tables 1 and 2). The bit register 130 and the configuration register 140 receive commands 170 from an automatic test pattern generator (ATPG) system (not shown) to specify which bits to test and select the clock source of the bits to test in the logic circuit 120 under test.

Figure 2:
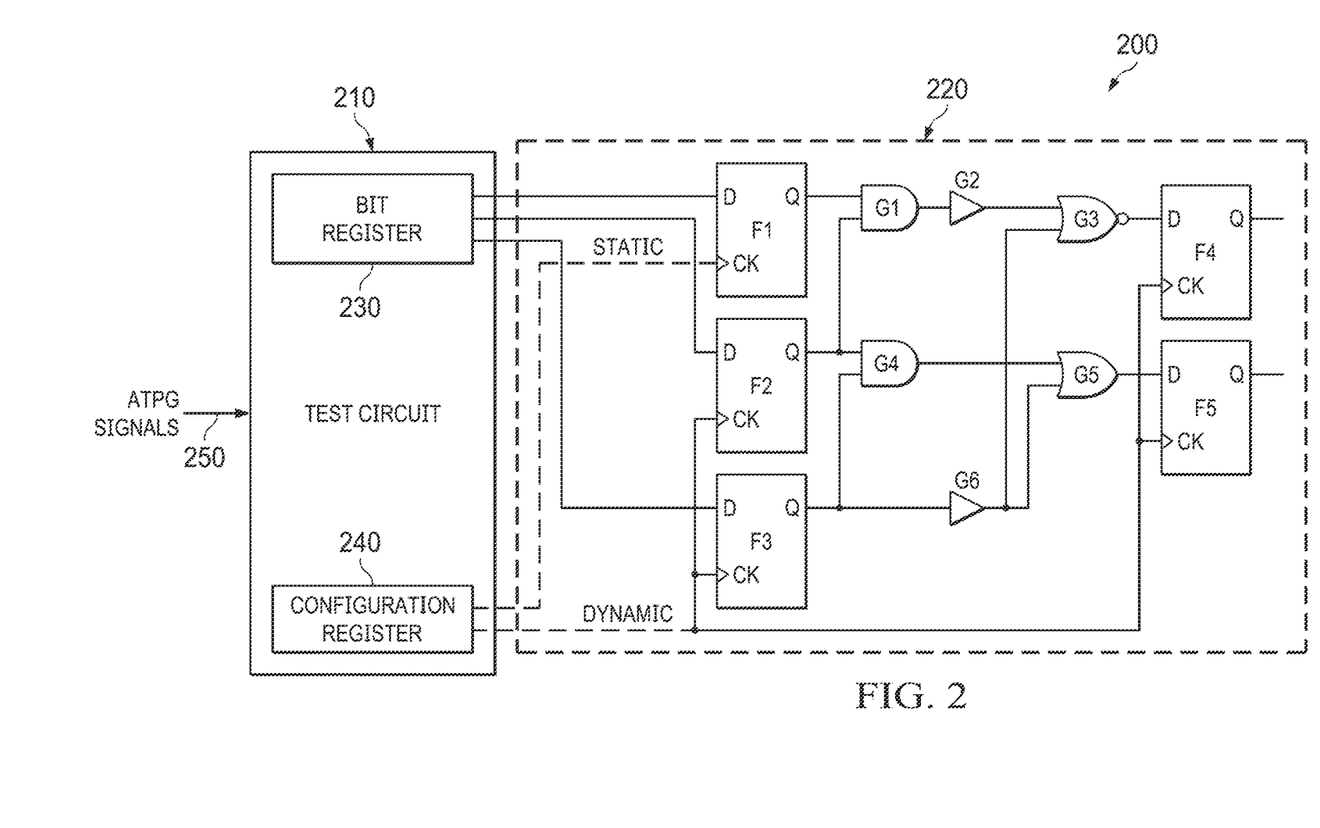
FIG. 2 illustrates an example circuit having a test circuit that provides static and dynamic clock sources to test a logic circuit under test.

FIG. 2 illustrates an example circuit 200 having a test circuit 210 that provides static and dynamic clock sources to test a logic circuit 220 under test. The test circuit 210 includes a bit register to 230 to specify bits (and associated initialization testing states) to be tested and a configuration register 240 to specify clock speeds at which to test the specified bits via different circuit paths in the logic circuit 220 under test. In this example, the logic circuit includes three testing paths for illustrative purposes but substantially more paths can be tested in a given integrated circuit design. In this example, a static testing path is determined between flip-flop F1 through gates G1, G2, and G3, and ending at the output of flip-flop F4. A dynamic testing path is shown between flip-flop F2 through gates G4 and G5 and ending at the output of flip-flop F5. Another dynamic path is between flip-flop F3 though gates G6 and G5 and ending at the output of F5. As shown, the configuration register 240 can specify a static clock source for the static path beginning at F1 and specify a dynamic clock source for the dynamic paths beginning at F2 and F3 respectively. Although F2 and F3 are driven via the same clock source in this example, it is possible that each of these paths could be driven at different clock source settings with respect to each other. Such differing sources in addition to the static and dynamic sources described herein can be specified in the configuration register 240.

Figure 3:
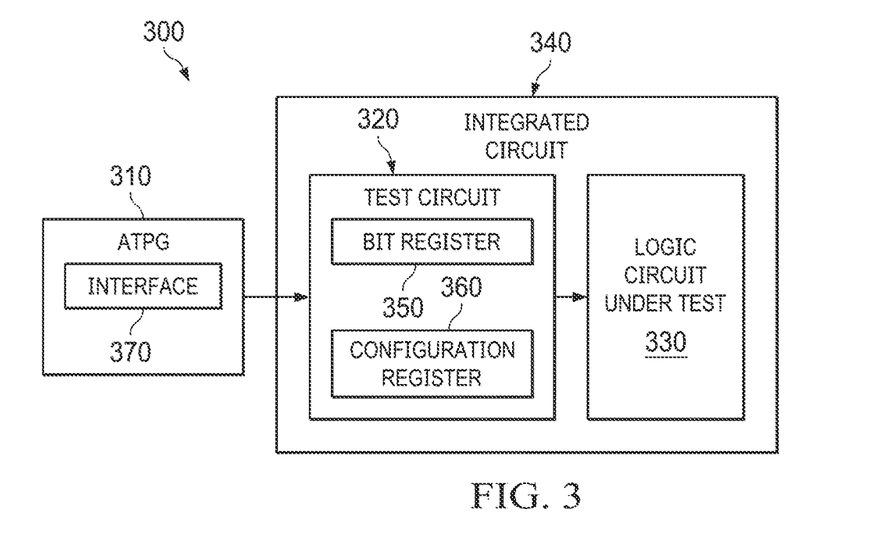
FIG. 3 illustrates an example system that includes an automatic test pattern generator to drive a test circuit that provides multiple clock sources to test a logic circuit under test.

FIG. 3 illustrates an example system 300 that includes an automatic test pattern generator 310 to drive a test circuit 320 that provides multiple clock sources to test a logic circuit 330 under test. The system 330 includes the automatic test pattern generator (ATPG) to generate test signals that specify which bits to test and to select a clock speed of the bits to test for the logic circuit under test in an integrated circuit 340. The test circuit 320 in the integrated circuit 340 tests signal timing of the logic circuit 330 under test in response to the test signals from the ATPG 310. The signal timing includes timing measurements to determine if an output of the logic circuit 330 under test changes state in response to a clock signal. The test circuit 330 includes a bit register 350 that receives which bits of the logic circuit 330 under test are to be tested from the ATPG 310 and in response to the selected clock signal. A configuration register 360 specifies a selected clock source from multiple clock source settings for the signal speed of the clock signal. The selected clock source for the clock signal is employed by the ATPG 310 to perform timing measurements of the specified bits of the bit register 310.

The bit register 350 and the configuration register 360 receive commands from the ATPG 310 to specify which bits to test and select the clock source of the bits to test in the logic circuit 330 under test. As shown, the ATPG 310 can include an interface 370 to initiate the timing measurements via the test circuit 320 for the logic circuit 330 under test. Various interface examples are possible. For example, the ATPG 310 can implement timing measurements for the logic circuit 330 under test in accordance with a generic test protocol interface, an IEEE 1500-based protocol interface, or a joint test action group (JTAG) protocol interface. The respective interfaces 370 can be employed to program the specified bits in the bit register 350 and the selected clock speed in the configuration register 360 to test the logic circuit 330 under test. The ATPG 310 can initiate transition fault testing for the logic circuit 330 under test as specified by the bit register 350 and the clock speed of the configuration register 360 according to a launch on extra/extended shift (LOES) test or a launch off capture test (LOC) where an example timing diagram for LOES testing is illustrated and described below with respect to FIG. 4.

Figure 4:
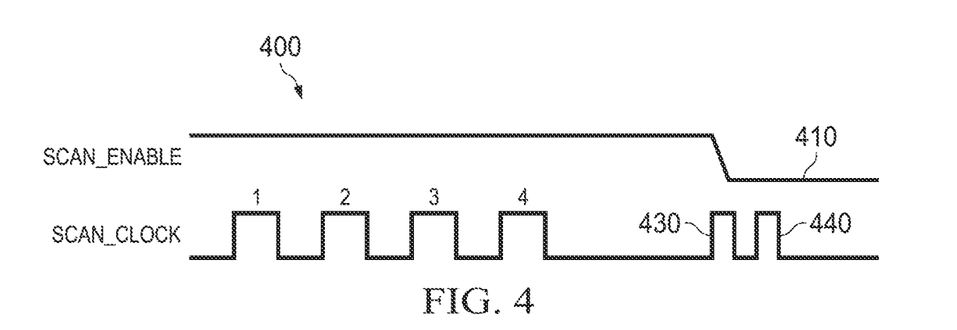
FIG. 4 illustrates an example timing diagram for delay fault testing of a circuit path.

FIG. 4 illustrates an example timing diagram for delay fault testing of a false circuit path. A timing relationship is shown between a scan enable signal at 410 which triggers a launch on extra/extended shift (LOES) testing described herein when the signal goes from high to low. Any transition fault testing can be employed such as launch off capture (LOC) methods, for example. In this example, shift clocks shown as clocks 1-4 are generated to commence a design shift operation. After shifting of desired data values into the logic circuit under test, at least two clock pulses of a test clock can be generated to perform the delay fault testing of the static and/or dynamic paths in the circuit under test. One clock pulse 430 launches a transition timing operation and a second clock pulse 440 clocks a capture of the output transition for a respective path.

Figure 5:
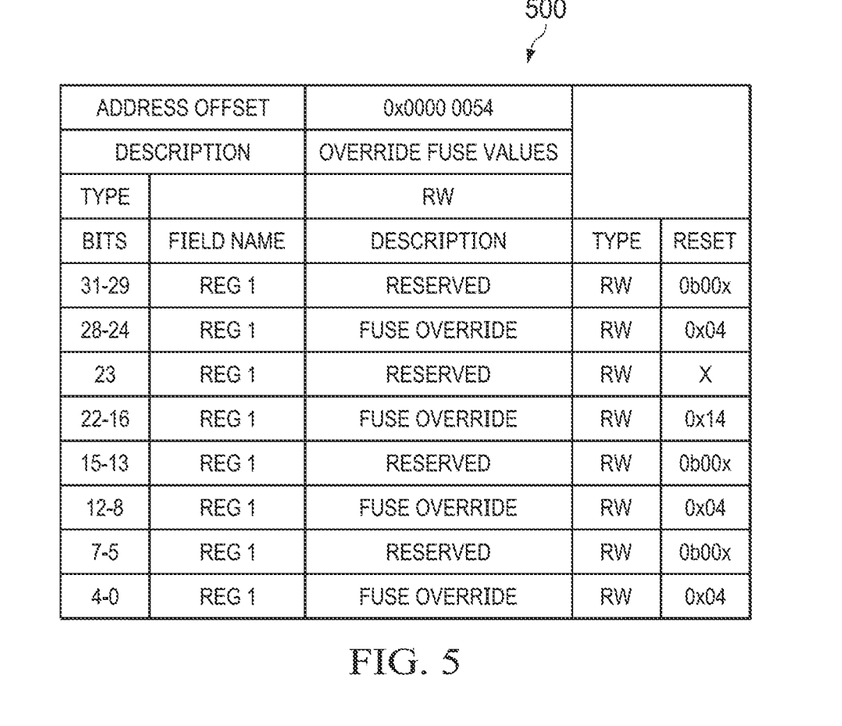
FIG. 5 illustrates an example diagram where dynamic and static fields are not specified to test a logic circuit under test.

FIG. 5 illustrates an example diagram 500 where dynamic and static fields are not specified to test a logic circuit under test. In this example, each described bit field for testing shown at 31:29, 28:24, 23, 22:16, 15:13, 12:8, 7:5, and 4:0 are merely specified for one source setting in which to test each of the respective bits for this example. This if functionally asynchronous paths (FAPs) are present, they would have to be marked as "X" and not tested and/or gated to be disabled during other dynamic path testing. Such gating or rules-based masking in the ATPG is a significant testing performance decrease over the configuration register described herein since FAP paths may not be tested at their respective clock speeds in many instances.

Figure 6:
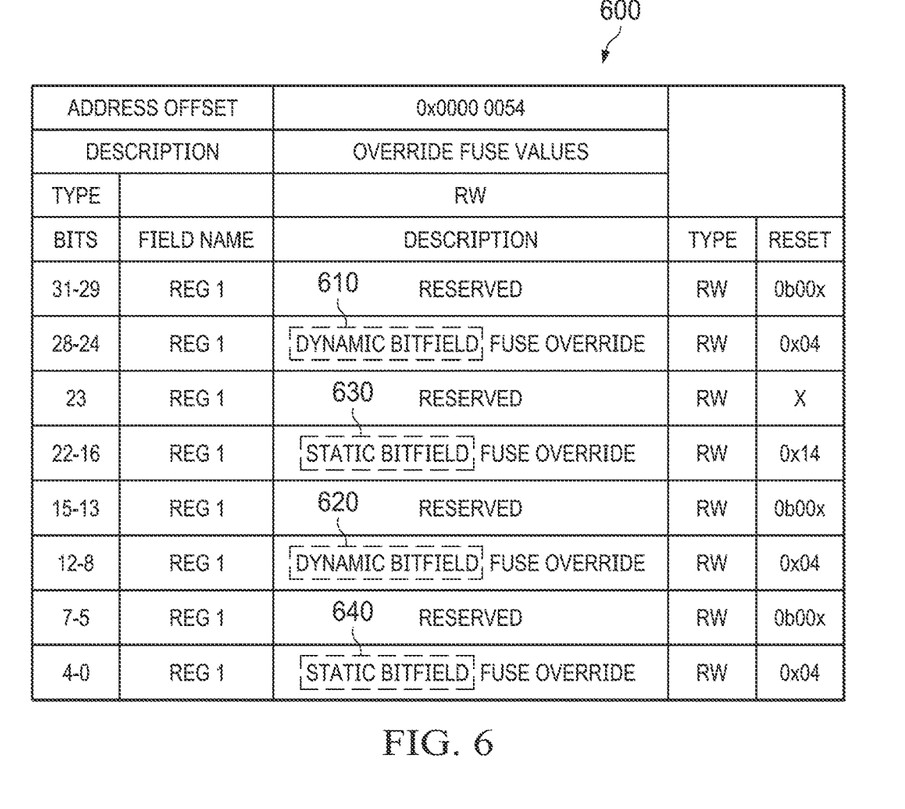
FIG. 6 illustrates an example diagram where dynamic and static fields are specified to test a logic circuit under test according to differing clock sources.

FIG. 6 illustrates an example diagram 600 where dynamic and static fields are specified via configuration as described herein to test a logic circuit under test according to differing clock source settings. As shown in this example, bits 28:24 and 12:8 are tested according to a dynamic bit field shown at 610 and 620. The bits 22:16 and 4:0 are specified according to a static bit field shown at 630 and 640. As noted previously, other clock source settings that differ with the static and dynamic setting described herein can also be specified. Table 1 below shows an RTL code fragment where bits and associated clock sources are defined. At line 221 of Table 1, register loading is defined as static where clock ckm_clrz is defined for static clock sources as clock_static. Lines 226 through 236 load default register testing values and lines 310 though 325 of Table 1 show testing code for the respective register bits. Table 2 below shows an RTL code fragment where bits and associated clock sources are defined. At line 92 of Table 2, register loading is defined as atspeed (e.g., dynamic) where clock ckm_clrz is defined for dynamic clock source settings as clock_atspeed. Lines 97 through 105 load default register testing values and lines 110 of Table 2 show testing code for the respective register bits. It is noted that testing address "054" for a given bit in a register at address 54 is tested using static clock speeds at line 316 of Table 1, whereas the same testing address "054" for another bit in the register at address 54 is tested using dynamic clock speeds at line 114 of Table 2.

TABLE 1

```
217    ---------------------------------------------------------------------------------------------
218    -- process: load_regs_static
219    ---------------------------------------------------------------------------------------------
220
221    load_regs: process (ckm_clrz, clock_static)
222
223       begin
224          if (ckm_clrz = '0') then                     -- set registers to reset values
225
226             sig_Register 1     <= "00000000000000000000000000000000" ;
227             sig_Register 2        <= "00000000000000000000000000000000" ;
228             sig_Register 3     <= "00000000000000000000000000000000" ;
229             sig_Register 4        <= "00000001000000010000000100000001" ;
230             sig_Register 5        <= "00000000000000000000000100000001" ;
231             sig_Register 6     <= "00100"                              ;
232             sig_Register 7     <= "00100"                              ;
233             sig_Register 8     <= "100000000"                          ;
234             sig_Register 9     <= "00001111000011110000011100000000" ;
235             sig_Register 10    <= "00100001001000000001000000000010" ;
236             sig_Register 11    <= "00000000000000000000000000000000" ;
TOPRCM.vhd                                                            231, 16       44%
310                sig_Register 5 (15 downto 8) <= vbusp_wdata(15 downto 8) ;
311             end if;
312             if (vbusp_byten(0) = '1') then
313                sig_Register 5 (7 downto 0) <= vbusp_wdata( 7 downto 0) ;
314             end if;
315
316             when X"054" =>                                 --Wr Addr = 0x054
317                if (vbusp_byten(3) = '1') then
318                   sig_Register 6 ( 4 downto 0) <= vbusp_wdata(28 downto 24) ;
319                end if;
320                if (vbusp_byten(1) = '1') then
321                   sig_Register 7( 4 downto 0) <= vbusp_wdata(12 downto 8) ;
322                end if;
323
324             when X"058" =>                                 --Wr Addr = 0x058
325                if (vbusp_byten(1) = '1') then
```

TABLE 2

```
88     ---------------------------------------------------------------------------------------------
89     -- process: load_regs_atspeed
90     ---------------------------------------------------------------------------------------------
91
92     load_regs: process (ckm_clrz, clock_atspeed)
93
```

TABLE 2-continued

```
94    begin
95      if (ckm_clrz = '0') then                    -- set registers to reset values
96
97        sig_ Register 13      <= "0010100"                                    ;
98        sig_ Register 14      <= "00100"                                      ;
99        sig_ Register 15      <= "00000000000000000000000000000000"           ;
100       sig_ Register 16      <= "00000000000000000000000000000000"           ;
101       sig_ Register 17      <= "00000000000000000000000000000000"           ;
102       sig_ Register 18      <= "00000000000000000000000000000000"           ;
103       sig_ Register 19      <= "00000000000000000000000000000000"           ;
104       sig_ Register 20      <= "00000000000000000000000000000000"           ;
105       sig_valid_waddr_atspeed_reg               <= '1' ;
106
107     elsif (rising_edge(clock_atspeed)) then
108
109
110       if (vbusp_dir='0' AND vbusp_req='1') then       -- VBUSP write
111         sig_valid_waddr_atspeed_reg <= '1'
112         case vbusp_address is
113
114           when X"054" =>                              -- Wr Addr = 0x054
115             if (vbusp_byten(2) = '1') then
116               sig_ Register 13 ( 6 downto 0) <= vbusp_wdata(22 downto 16) ;
117             end if;
118             if (vbusp_byten(0) = '1') then
119               sig_ Register 14 (4 downto 0) <= vbusp_wdata( 4 downto 0) ;
120             end if;
121
122           when X"060" =>                              -- Wr Addr = 0x060
123             if (vbusp_byten(3) = '1') then
124               sig_ Register 15(31 downto 24) <= vbusp_wdata(31 downto 24) ;
```

Figure 7:
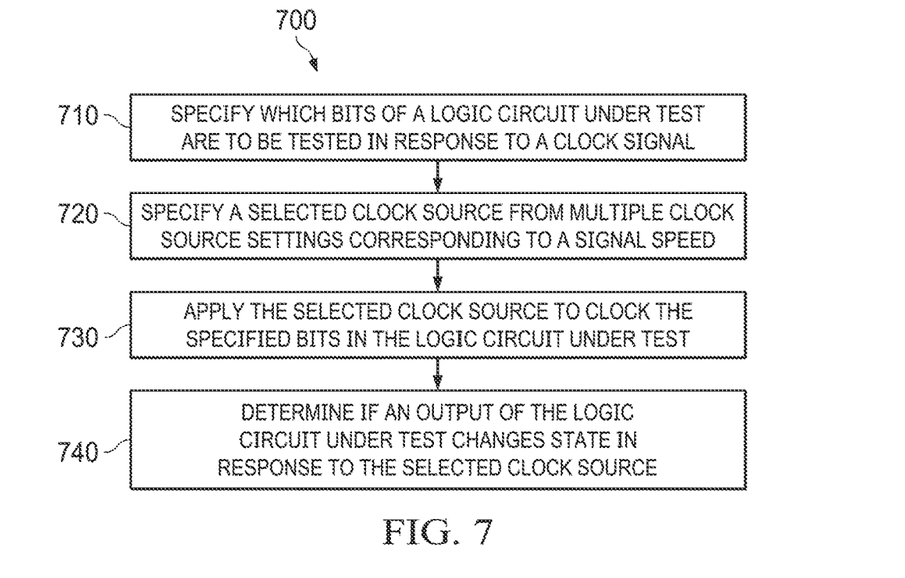
FIG. 7 illustrates an example method that specifies a clock source from multiple clock source settings to test a logic circuit under test.

In view of the foregoing structural and functional features described above, an example method will be better appreciated with reference to FIG. 7. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured as machine readable instructions stored in memory and executable in an integrated circuit or a processor, for example.

FIG. 7 illustrates an example method 700 that specifies a clock speed from multiple clock source settings to test a logic circuit under test. At 710, the method 700 includes specifying which bits of a logic circuit under test are to be tested in response to a clock signal via register transfer-level (RTL) instructions that are implemented on an integrated circuit. At 720, the method 700 includes specifying a selected clock source from multiple clock source settings corresponding to a signal speed via the RTL instructions. At 730, the method 700 includes applying the selected clock source to clock the specified bits in the logic circuit under test. At 740, the method 700 includes determining if an output of the logic circuit under test changes state in response to the clock source. The RTL instructions can specify a default testing value for the bits to be tested in one example. The RTL instructions can also specify bits at an address to be tested at one clock source setting and specify other bits at the address to be tested at another clock source setting.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
a bit register configured to identify a set of bits; and
a configuration register configured to identify:
a first clock source for a first bit of the set of bits at a first address based on a first timing requirement; and
a second clock source for a second bit of the set of bits at a second address based on a second timing requirement.

2. The circuit of claim 1, wherein the first clock source is a dynamic clock speed at a maximum clock speed.

3. The circuit of claim 1, wherein the second clock source is a static clock speed that is less than a maximum clock speed.

4. The circuit of claim 1, wherein the bit register and the configuration register are coupled to a logic circuit under test.

5. The circuit of claim 4, wherein:
the first timing requirement is based on a first path in the logic circuit under test; and
the second timing requirement is based on a second path in the logic circuit under test.

6. The circuit of claim 1, wherein:
the bit register and the configuration register are implemented via register transfer-level (RTL) instructions;
the bit register identifies each bit of the set of bits to be tested; and
the configuration register identifies each clock source for each bit of the set of bits to be tested in the configuration register.

7. The circuit of claim 6, wherein the RTL instructions specify a default testing value for the set of bits to be tested as specified in the bit register.

8. The circuit of claim 1, wherein the bit register and the configuration register are coupled to an automatic test pattern generator (ATPG) system.

9. The circuit of claim 8, wherein the ATPG implements timing measurements for a logic circuit under test in accordance with a generic test protocol interface, an IEEE 1500-based protocol interface, or a joint test action group (JTAG) protocol interface, the respective interfaces to program the set of bits in the bit register and a specified clock source in the configuration register to test the logic circuit under test.

10. The circuit of claim 9, wherein the ATPG initiates transition fault testing for the logic circuit under test as specified by the bit register and the specified clock source of the configuration register according to a launch on extra/extended shift (LOES) test or a launch off capture test (LOC).

11. A system, comprising:
an automatic test pattern generator (ATPG) to generate a test signal that specifies a set of bits to test and selects respective clock speeds for each of the set of bits;
a circuit under test; and
a test circuit coupled to the ATPG and the circuit under test, wherein the test circuit includes:
a bit register configured to receive the test signal indicating a set if bits; and
a configuration register configured to identify:
a first clock source for a first bit of the set of bits at a first address based on a first timing requirement; and
a second clock source for a second bit of the set of bits at a second address based on a second timing requirement.

12. The system of claim 11, wherein the first clock source is a dynamic clock speed at a maximum clock speed.

13. The system of claim 11, wherein the second clock source is a static clock speed that is less than a maximum clock speed.

14. The system of claim 11, wherein:
the first timing requirement is based on a first path in a logic circuit under test; and
the second timing requirement is based on a second path in the logic circuit under test.

15. The system of claim 11, wherein:
the bit register and the configuration register are implemented via register transfer-level (RTL) instructions;
the bit register identifies each bit of the set of bits to be tested; and
the configuration register identifies each clock source for each bit of the set of bits to be tested in the configuration register.

16. The system of claim 15, wherein the RTL instructions specify a default testing value for the set of bits to be tested as specified in the bit register.

17. A method, comprising:
specifying, in a bit register, a set of bits;
specifying, in a configuration register, a selected clock source from multiple clock sources for each of the set of bits;
applying a first clock source to a first bit of the set of bit at a first address based on a first timing requirement;
applying a second clock source to a second bit of the set of bits at a second address based on a second timing requirement;
determining if a first output of a logic circuit under test changes state in response to applying the first clock source; and
determining if a second output of the logic circuit under test changes state in response to applying the second clock source.

18. The method of claim 17, wherein:
the first clock source is a dynamic clock speed at a maximum clock speed; and
the second clock source is a static clock speed that is less than the maximum clock speed.

19. The method of claim 17, wherein:
the first timing requirement is based on a first path in a logic circuit under test; and
the second timing requirement is based on a second path in the logic circuit under test.

20. The method of claim 17, wherein:
the bit register and the configuration register are implemented via register transfer-level (RTL) instructions; and
the RTL instructions specify a default testing value for the set of bits.

* * * * *